(12) United States Patent
Lee (10) Patent No.: US 9,912,321 B2
(45) Date of Patent: Mar. 6, 2018

(54) DATA OUTPUT CIRCUIT (71) Applicant: SK hynix Inc., Gyeonggi-do (KR)

(72) Inventor: Hyuk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 129 days.

(21) Appl. No.: 15/177,245

(22) Filed: Jun. 8, 2016

(65) Prior Publication Data

US 2017/0194946 A1  Jul. 6, 2017

(30) Foreign Application Priority Data

Dec. 30, 2015 (KR) .................. 10-2015-0190109

(51) Int. Cl.
*H03B 1/00* (2006.01)
*H03K 3/00* (2006.01)
*H03K 3/013* (2006.01)
*H03K 3/356* (2006.01)

(52) U.S. Cl.
CPC ....... *H03K 3/013* (2013.01); *H03K 3/356113* (2013.01)

(58) Field of Classification Search
USPC ................................................ 327/108–112
See application file for complete search history.

(56) References Cited

FOREIGN PATENT DOCUMENTS

| KR | 100862316 | 10/2008 |
|---|---|---|
| KR | 1020100003928 | 1/2010 |

*Primary Examiner* — Adam Houston
(74) *Attorney, Agent, or Firm* — IP & T Group LLP (57) ABSTRACT

Provided is a data output circuit including: a control code generation unit suitable for generating a control code; and a driving unit suitable for driving an output pad with driving power determined by the control code in response to a data signal, wherein the control code generation unit generates an initial value of the control code in an initialization section, a calibration value of the control code in a calibration section, and a blocking value of the control code before the initialization section, wherein the calibration value is adjusted by a calibration operation in the calibration section, and wherein the driving unit is blocked by the blocking value.

20 Claims, 4 Drawing Sheets

DATA OUTPUT CIRCUIT

CROSS-REFERENCE TO RELATED APPLICATIONS

The present application claims priority of Korean Patent Application No. 10-2015-0190109, filed on Dec. 30, 2015, which is incorporated herein by reference in its entirety.

BACKGROUND

1. Field

Exemplary embodiments of the present invention relate generally to a data output circuit.

2. Description of the Related Art

Figure 1:
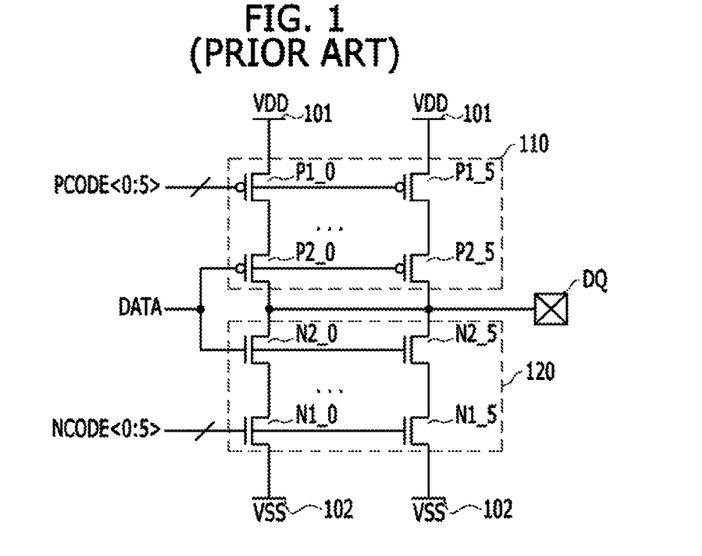
FIG. 1 is a circuit diagram illustrating the configuration of a conventional output driver.

FIG. 1 is a circuit diagram illustrating the configuration of a conventional output driver.

Referring to FIG. 1, an output driver may include first and second driving units 110 and 120 coupled to an output pad DQ.

The first driving unit 110 may pull-up drive the output pad DQ with driving power determined by a first control code PCODE<0:5> in response to a data signal DATA. The first driving unit 110 may include a plurality of first and second PMOS transistors P1_0 to P1_5 and P2_0 to P2_5 coupled between the output pad DQ and a pull-up power node 101. A power supply voltage VDD is applied to the pull-up power node. The first PMOS transistors P1_0 to P1_5 may be turned on/off in response to a corresponding first control signal among a plurality of first control signals PCODE<0> to PCODE<5> included in the first control code PCODE<0:5>. The second PMOS transistors P2_0 to P2_5 may be turned on/off in response to the data signal DATA.

The second driving unit 120 may pull-down drive the output pad DQ with driving power determined by a second control code NCODE<0:5> in response to the data signal DATA. The second driving unit 120 may include a plurality of first and second NMOS transistors N1_0 to N1_5 and N2_0 to N2_5 coupled between the output pad DQ and a pull-down power node 102. A base voltage VSS is applied to the pull-down power node 102. The first NMOS transistors N1_0 to N1_5 may be turned on/off in response to a corresponding second control signal among a plurality of second control signals NCODE<0> to NCODE<5> included in the second control code NCODE<0:5>. The second NMOS transistors N2_0 to N2_5 may be turned on/off in response to the data signal DATA.

Figure 2:
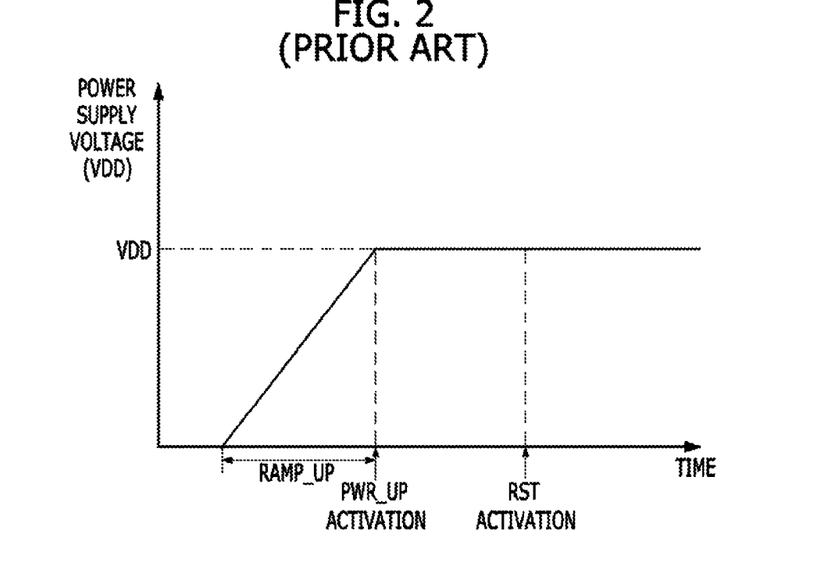
FIG. 2 is a diagram explaining power-up of a semiconductor device included in the output driver illustrated in FIG. 1.

FIG. 2 is a diagram explaining power-up of a semiconductor device included in the output driver illustrated in FIG. 1.

Referring to FIG. 2, the level of the power supply voltage VDD increases for the power up of the semiconductor device. Briefly, the power up of the semiconductor device may represent an operation of turning on the semiconductor device.

When the level of the power supply voltage VDD is stabilized through a ramp-up section RAMP_UP, during which the level of the power supply voltage VDD increases, a power-up signal PWR_UP can be enabled. The first and second control codes PCODE<0:5> and NCODE<0:5> have arbitrary values from when the power-up signal PWR_UP is enabled to when an initialization signal RST is enabled. For this reason, some transistors among the PMOS transistors P1_0 to P1_5 and first NMOS transistors N1_0 to N1_5 are turned on, so that leakage current may occur between the output pad DQ and the voltage nodes 101 and 102.

SUMMARY

Various embodiments are directed to a data output circuit capable of reducing leakage current in a time period from when power-up has been completed to when a control code has been initialized.

In an embodiment, a data output circuit may include: a control code generation unit suitable for generating a control code; and a driving unit suitable for driving an output pad with driving power determined by the control code in response to a data signal, wherein the control code generation unit generates an initial value of the control code in an initialization section, a calibration value of the control code in a calibration section, and a blocking value of the control code before the initialization section, wherein the calibration value is adjusted by a calibration operation in the calibration section, and wherein the driving unit is blocked by the blocking value.

In an embodiment, a data output circuit may include: a control code generation unit suitable for generating a control code; and a plurality of transistor pairs each comprising: a first transistor operable according to an assigned control signal included in the control code; and a second transistor operable according to a data signal, wherein the first and second transistors of the respective transistor pairs are coupled in series between an output pad and respective driving voltage nodes, wherein the control code generation unit generates an initial value of the control code in an initialization section, a calibration value of the control code in a calibration section, and a blocking value of the control code before the initialization section, wherein the calibration value is adjusted by a calibration operation in the calibration section, and wherein the transistor pairs are inoperable by the blocking value.

DETAILED DESCRIPTION

Hereinafter, various embodiments will be described with reference to the accompanying drawings so that a person skilled in the art to which the present invention belongs can readily implement the technical concept disclosed herein.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

Figure 3:
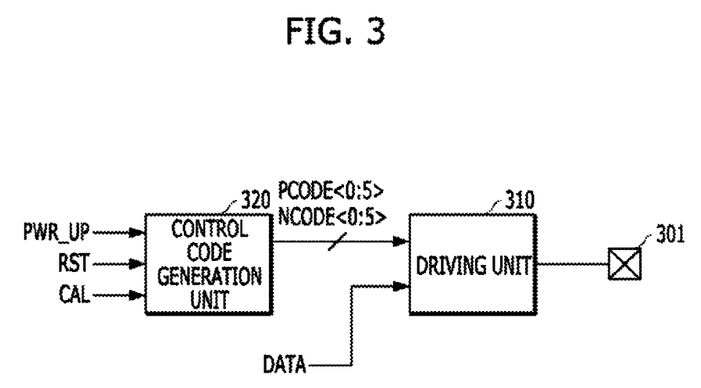
FIG. 3 is a block diagram illustrating the configuration of a data output circuit, according to an embodiment of the present invention.

Referring now to FIG. 3 a data output circuit is provided, according to an embodiment of the present invention.

According to the embodiment of FIG. 3 the data output circuit may include an output pad 301, a driving unit 310, and a control code generation unit 320.

The driving unit 310 may drive the output pad 301 with driving power determined by first and second control codes NCODE<0:5> and PCODE<0:5> in response to a data signal DATA. The driving unit 310 may pull-up drive the output pad 301 when the data signal DATA has a low level, and pull-down drive the output pad 301 when the data signal DATA has a high level. The pull-up driving power of the driving unit 310 may be determined by the first control code PCODE<0:5>, and the pull-down driving power thereof may be determined by the second control code NCODE<0:5>.

The pull-up driving power of the driving unit 310 may be determined by the first control code PCODE<0:5>. The pull-up driving power of the driving unit 310 may be maximized when the first control code PCODE<0:5> has a minimum value (e.g., a binary value of "000000"), and may be minimized when the first control code PCODE<0:5> has a maximum value (e.g., a binary value of "111111"). The pull-down driving power of the driving unit 310 may be determined by the second control code NCODE<0:5>. The pull-down driving power of the driving unit 310 may be maximized when the second control code NCODE<0:5> has a maximum value (e.g., a binary value of "111111"), and may be minimized when the second control code NCODE<0:5> has a minimum value (e.g., a binary value of "000000"). For reference, when driving power is minimized, the driving of the driving unit 310 may be blocked.

The control code generation unit 320 generates the first and second control codes PCODE<0:5> and NCODE<0:5>. The control code generation unit 320 may output the first and second control codes PCODE<0:5> and NCODE<0:5> having different values depending on operation sections. The control code generation unit 320 may be configured to output the first and second control codes PCODE<0:5> and NCODE<0:5> having an initial value in an initialization section of a semiconductor device; to output the first and second control codes PCODE<0:5> and NCODE<0:5> having a calibration value adjusted depending on a calibration operation in a calibration section; and to output the first and second control codes PCODE<0:5> and NCODE<0:5> having a blocking value for blocking the driving of the driving unit 310 before an initialization section.

The control code generation unit 320 may be configured to generate the first and second control codes PCODE<0:5> and NCODE<0:5> having the blocking value in response to a power-up signal PWR_UP; to generate the first and second control codes PCODE<0:5> and NCODE<0:5> having the initial value in response to an initialization signal RST; and to generate first and second control codes PCODE<0:5> and NCODE<0:5> having the calibration value in response to a calibration signal CAL.

The initial value may be assigned in-between the minimum and maximum values of the first and second control codes PCODE<0:5> and NCODE<0:5>. The initial value may be a value for the driving unit 310 to have the driving power in-between the minimum and maximum driving power. For example, the initial value may be a binary value of "000111".

A reason for setting the initial value between the minimum and maximum values is for preventing a drastic change of the first and second control codes PCODE<0:5> and NCODE<0:5> during the calibration operation and thus for shortening the calibration operation time. More specifically, during the calibration section for adjusting the driving power of the driving unit 310, the first and second control codes PCODE<0:5> and NCODE<0:5> are determined as the calibration value depending on a result of the calibration operation. When the minimum value of the first and second control codes PCODE<0:5> and NCODE<0:5> is assigned as the initial value and the maximum value of the first and second control codes PCODE<0:5> and NCODE<0:5> is assigned as the calibration value, the first and second control codes PCODE<0:5> and NCODE<0:5> may drastically change between the initial value and the calibration value or between the minimum and maximum values during the calibration operation, which requires a long time. The same result is caused when the maximum value of the first and second control codes PCODE<0:5> and NCODE<0:5> is assigned as the initial value and the minimum value of the first and second control codes PCODE<0:5> and NCODE<0:5> is assigned as the calibration value. Therefore, the initial value is preferably assigned between the minimum and maximum values for preventing a drastic change of the first and second control codes PCODE<0:5> and NCODE<0:5> during the calibration operation and thus for shortening the calibration operation time.

The calibration value may be adjusted through the calibration operation. The calibration operation will be described later in connection with FIG. 7.

The blocking value may include at least one of the minimum and maximum values of the first and second control codes PCODE<0:5> and NCODE<0:5>. The blocking value of the first control code PCODE<0:5> may be the maximum value "111111", and the blocking value of the second control code NCODE<0:5> may be the minimum value "000000". Due to the blocking value, the driving of the driving unit 310 may be blocked regardless of the value of a data signal DATA. The pull-up driving of the driving unit 310 may be blocked regardless of the value of a data signal DATA due to the first control code PCODE<0:5> of the blocking value "111111", and the pull-down driving thereof may be blocked regardless of the value of a data signal DATA due to the second control code NCODE<0:5> of the blocking value "000000".

In the conventional data output circuit, a code value is not determined from when power-up of a semiconductor device has been completed to when first and second control codes PCODE<0:5> and NCODE<0:5> having an initial value is outputted, and thus leakage current may occur through an output pad. In contrast, the data output circuit shown in FIG. 3 outputs first and second control codes PCODE<0:5> and NCODE<0:5> having the blocking value after power-up has been completed, so that leakage current occurring through the output pad 301 can be reduced.

Figure 4:
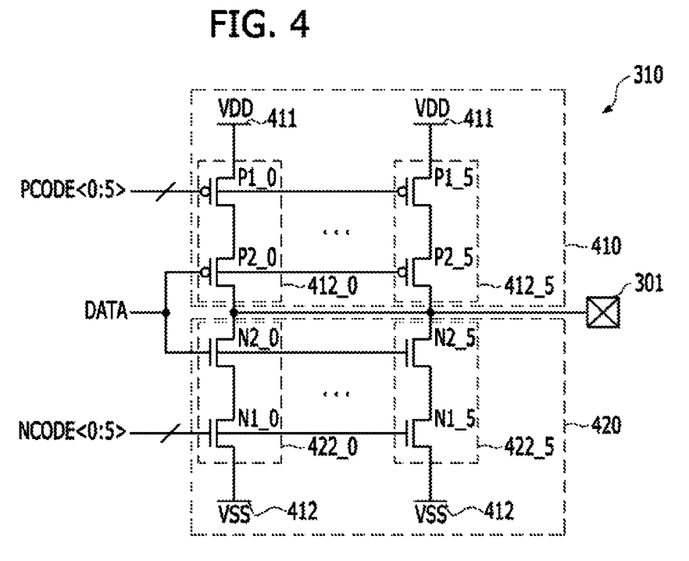
FIG. 4 is a circuit diagram illustrating the configuration of a driving unit illustrated in FIG. 3.

FIG. 4 is a circuit diagram illustrating a configuration of the driving unit 310, according to an embodiment of the invention Referring to FIG. 4, the driving unit 310 may include a pull-up driving unit 410 and a pull-down driving unit 420.

The pull-up driving unit 410 may pull-up drive the output pad 301 with driving power determined by a first control code PCODE<0:5> in response to a data signal DATA. The pull-up driving unit 410 may include a plurality of first transistor pairs 412_0 to 412_5 coupled between the output pad 301 and a pull-up driving voltage node 411. The respective first transistor pairs 412_0 to 412_5 may include a pair of PMOS transistors. For example, first transistor pair 412_0 may include PMOS transistors P1_0 and P2_0, while first transistor pair 412_5 may include transistors P1_5 and P2_5. The PMOS transistors P1_0 to P1_5 may be switched on/off in response to an assigned control signal among a plurality of control signals PCODE<0> to PCODE<5> included in the first control code PCODE<0:5>. The PMOS transistors P2_0 to P2_5 may be switched on/off in response to a data signal DATA. The PMOS transistors P1_0 to P1_5 included in the pull-up driving unit 410 may be all turned off when the first control code PCODE<0:5> has the blocking value (i.e., binary "111111").

The pull-down driving unit 420 may pull-down drive the output pad 301 with driving power determined by a second control code NCODE<0:5> in response to a data signal DATA. The pull-down driving unit 420 may include a plurality of second transistor pairs 422_0 to 422_5 coupled between the output pad 301 and a pull-down driving voltage node 421. Each of the respective second transistor pairs 422_0 to 422_5 may include a pair of NMOS transistors. For example, the second transistor pair 422_0 may include the pair of NMOS transistors N1_0 and N2_0, whereas the second transistor pair 422_5 may include the pair of NMOS transistors and N1_5 and N2_5. The NMOS transistors N1_0 to N1_5 may be switched on/off in response to assigned control signals among a plurality of control signals NCODE<0> to NCODE<5> included in the second control code NCODE<0:5>. The NMOS transistors N2_0 to N2_5 may be switched on/off in response to a data signal DATA. The NMOS transistors N1_0 to N1_5 included in the pull-down driving unit 420 may be all turned off when the second control code NCODE<0:5> has the blocking value (i.e., binary "000000").

The pull-up driving voltage node 411 may be a voltage node for supplying a pull-up voltage VDD, and the pull-down driving voltage node 412 may be a voltage node for supplying a pull-down voltage VSS.

Figure 5:
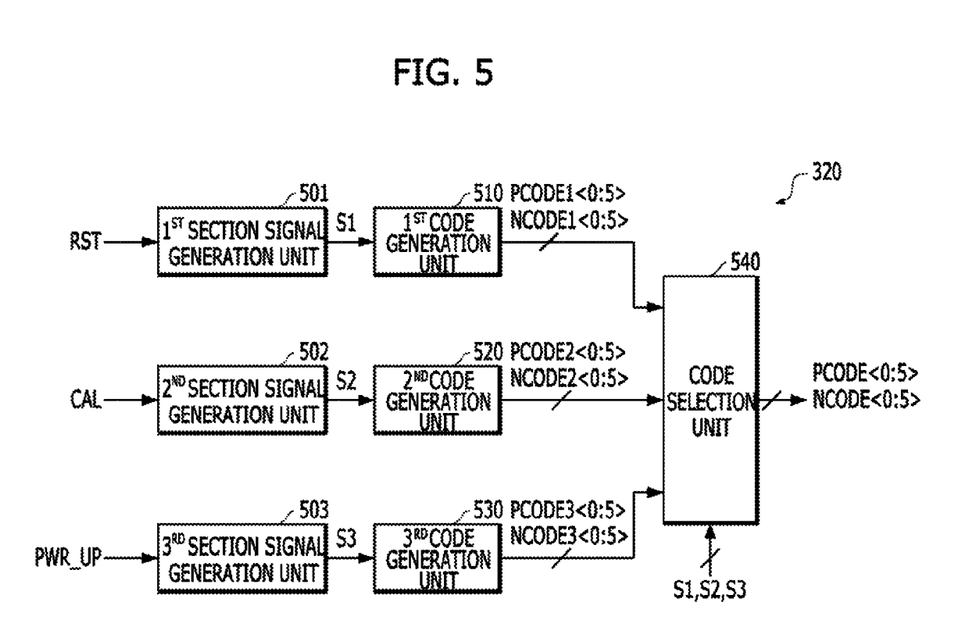
FIG. 5 is a block diagram illustrating the configuration of a control code generation unit illustrated in FIG. 3, according to an embodiment of the invention.

FIG. 5 is a block diagram illustrating a configuration of the control code generation unit 320, according to an embodiment of the invention According to the embodiment of FIG. 5, the control code generation unit 320 may include first to third section signal generation units 501 to 503, first to third code generation units 510 to 530, and a code selection unit 540.

The first code generation unit 510 may generate first codes PCODE1<0:5> and NCODE1<0:5> having an initial value in an initialization section. The first code generation unit 510 may generate the first codes PCODE1<0:5> and NCODE1<0:5> in the initialization section in response to the initialization signal RST. The first code generation unit 510 may generate a first section signal S1 which is enabled during the initialization section when the initialization signal RST is enabled.

The second code generation unit 520 may generate second codes PCODE2<0:5> and NCODE2<0:5> having a calibration value in the calibration section. The second code generation unit 520 may generate the second codes PCODE2<0:5> and NCODE2<0:5> during the calibration section in response to the calibration signal CAL. The second code generation unit 520 may generate a second section signal S2 which is enabled during the calibration section when the calibration signal CAL is enabled.

The third code generation unit 530 may generate third codes PCODE3<0:5> and NCODE3<0:5> having a blocking value before the initialization section. The third code generation unit 530 may generate the third codes PCODE3<0:5> and NCODE3<0:5> during an assigned section in response to the power-up signal PWR_UP. The third code generation unit 530 may generate a third section signal S3 enabled during an assigned section when the power-up signal PWR_UP is enabled.

The code selection unit 540 may select and output the first codes PCODE1<0:5> and NCODE1<0:5> having the initial value as the control codes PCODE<0:5> and NCODE<0:5> in the initialization section in which the first section signal S1 is enabled; may select and output the second codes PCODE2<0:5> and NCODE2<0:5> having the calibration value as the control codes PCODE<0:5> and NCODE<0:5> in the calibration section in which the second section signal S2 is enabled; and may select and output the third codes PCODE3<0:5> and NCODE3<0:5> having the blocking value as the control codes PCODE<0:5> and NCODE<0:5> in a section in which the third section signal S3 is enabled before the initialization section.

Figure 6:
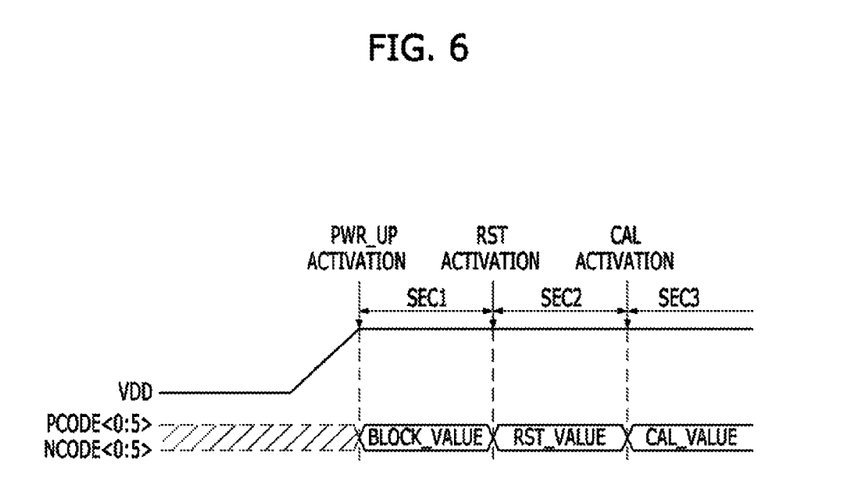
FIG. 6 is a diagram explaining the operation of a data output circuit illustrated in FIG. 3; according to an embodiment of the present invention.

FIG. 6 is a diagram explaining the operation of the data output circuit illustrated in FIG. 3.

Referring to FIG. 6, for power-up of a semiconductor device including the data output circuit, the level of the power supply voltage VDD increases. Briefly, the power up of a semiconductor device may represent an operation of turning on the semiconductor device.

When the level of the power supply voltage VDD is stabilized through a ramp-up section RAMP_UP in which the level of the power supply voltage VDD increases, the power-up signal PWR_UP may be enabled (activated). In the data output circuit of FIG. 3, the control code generation unit 320 may output first and second control codes PCODE<0:5> and NCODE<0:5> having different values depending on the sections SEC1, SEC2 and SEC3.

The control code generation unit 320 may output the third codes PCODE3<0:5> and NCODE3<0:5> having the blocking value BLOCK_VALUE in a section SEC1 in which the third section signal S3 is enabled from when the power-up signal PWR_UP is enabled to when the initialization signal RST is enabled. In the section SEC1, the driving unit 310 may block current between the output pad 301 and the power supply voltage nodes 411 and 412.

The control code generation unit 320 may output the first codes PCODE1<0:5> and NCODE1<0:5> having the initialization value RST_VALUE in the initialization section SEC2 in which the first section signal S1 is enabled from when the initialization signal RST is enabled to when the calibration signal CAL is enabled. In the initialization section SEC2, the driving unit 310 may have driving power in-between the minimum driving power and the maximum driving power of the driving unit 310.

The control code generation unit 320 may output the second codes PCODE2<0:5> and NCODE2<0:5> having the calibration value CAL_VALUE in the calibration section SEC3 in which the second section signal S2 is enabled after the calibration signal CAL is enabled. In the calibration section SEC3, the driving unit 310 may have driving power adjusted by the calibration operation.

Figure 7:
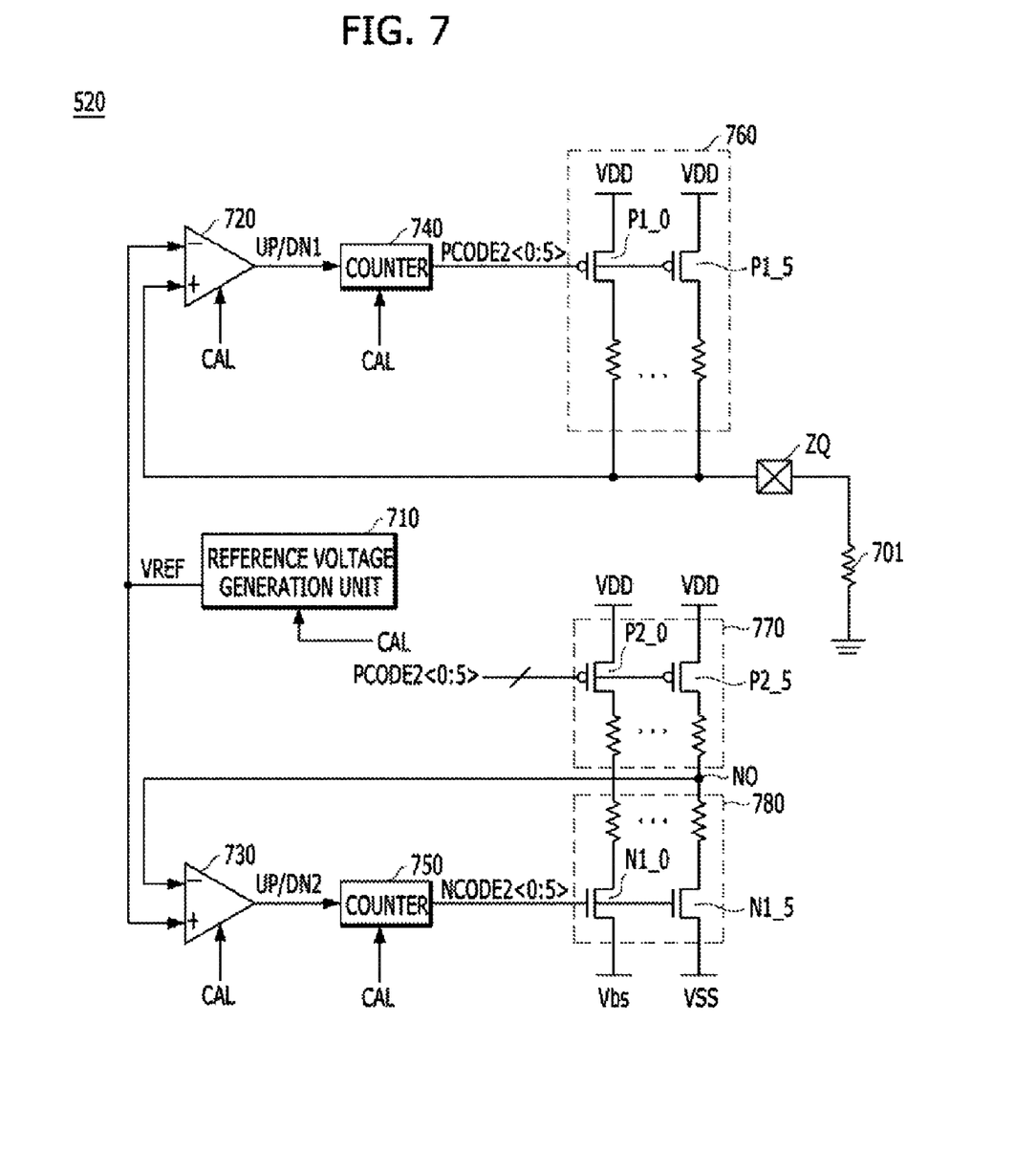
FIG. 7 is a circuit diagram illustrating the configuration of a second code generation unit, according to an embodiment of the present invention.

FIG. 7 is a circuit diagram illustrating the configuration of the second code generation unit 520, according to an embodiment of the invention.

According to the embodiment of FIG. 7, the second code generation unit 520 may include a reference voltage generation unit 710, comparators 720 and 730, counters 740 and 750, first and second calibration resistance units 760 and 780, a dummy calibration resistance unit 770, a calibration node ZQ, and an external resistor 701.

The first calibration resistance unit 760 may include a plurality of pull-up resistance units operable according to the second code PCODE2<0:5> having the calibration value. The dummy calibration resistance unit 770 may be configured to be the same as the first calibration resistance unit 760, and the pull-down calibration resistance unit 780 may include a plurality of pull-down resistors operable according to the second code NCODE2<0:5> having the calibration value.

The first calibration resistance unit 760 is configured to primarily generate and calibrate the second code PCODE2<0:5> with the external resistor 701 coupled to the calibration node ZQ. The second calibration resistance unit 780 is configured to generate the second code NCODE2<0:5> using the second code PCODE2<0:5> generated through the first calibration resistance unit 760. In addition, in this process, the dummy calibration resistance unit 770 having the same resistance value as the first calibration resistance unit 760 may be used.

The comparator 720 compares the voltage of the calibration node ZQ, which is generated by coupling the first calibration resistance unit 760 to the external resistor 701 (e.g., 240Ω) electrically connected with the calibration node ZQ, with a reference voltage VREF (generally set to VDD/2) generated by the reference voltage generation unit 710, and generates an up/down signal UP/DN1.

The counter 740 may generate the second code PCODE2<0:5> in response to the up/down signal UP/DN1. The second code PCODE2<0:5> may be used to control the resistance value of the first calibration resistance unit 760 by switching on/off the resistors of the first calibration resistance unit 760. The controlled resistance value of the first calibration resistance unit 760 exerts an influence on the voltage of the calibration node ZQ, and then the aforementioned operation is repeated. That is to say, the first calibration resistance unit 760 calibrate the second code PCODE2<0:5> having the calibration value such that the resistance value of the first calibration resistance unit 760 can be the same as the resistance value of the external resistor 701 (pull-up calibration).

The second code PCODE2<0:5> generated through the pull-up calibration operation is inputted to the dummy calibration resistance unit 770, and thus determines the resistance value of the dummy calibration resistance unit 770. Similarly to the pull-up calibration operation, during a pull-down calibration operation, the resistance value of the second calibration resistance unit 780 calibrate the second code NCODE2<0:5> having the calibration value such that the voltage of an internal node NO is the same as the reference voltage VREF using the comparator 730 and the counter 750 (pull-down calibration). Such pull-up/pull-down calibration operations may be performed in the calibration section SEC3 in which the second section signal S2 is enabled after the calibration signal CAL is enabled.

The second codes PCODE2<0:5> and NCODE2<0:5> generated through a calibration operation may be used to adjust the driving power of the driving unit 310 during the calibration section SEC3. Such a calibration operation may be performed to increase the quality of data through general impedance matching and to enable a semiconductor device to operate at a high speed.

For reference, FIGS. 1 and 4 show that the respective first control signals PCODE<0> to PCODE<5> are input to respective gates of the first PMOS transistors P1_0 to P1_5 and the respective second control signals NCODE<0> to NCODE<5> are inputted to respective gates of the first NMOS transistors N1_0 to N1_5.

Although the embodiments have been described about a case where a driving unit includes six pairs of transistors, and each code is configured with six bits, the number of transistor pairs and the number of bits of each code may vary depending on designs.

According to the embodiments, leakage current occurring from a data output circuit in a certain section before a control code is initialized can be reduced.

Although various embodiments have been described for illustrative purposes, it will be apparent to those skilled in the art that various changes and modifications may be made without departing from the spirit and/or scope of the invention as defined in the following claims.

What is claimed is:
1. A data output circuit comprising:
a control code generation unit suitable for generating a control code; and
a driving unit suitable for driving an output pad with driving power determined by the control code in response to a data signal,
wherein the control code generation unit generates an initial value of the control code in an initialization section, a calibration value of the control code in a calibration section, and a blocking value of the control code before the initialization section, wherein the calibration value is adjusted by a calibration operation in the calibration section, and wherein the driving unit is blocked by the blocking value.

2. The data output circuit of claim 1, wherein the initialization value falls in between minimum and maximum values of the control code.

3. The data output circuit of claim 1, wherein the blocking value comprises at least one of minimum value and a maximum value of the control code.

4. The data output circuit of claim 1, wherein the control code generation unit comprises:
   a first code generation unit suitable for generating the control code having the initialization value;
   a second code generation unit suitable for generating the control code having the calibration value;
   a third code generation unit suitable for generating the control code having the blocking value; and
   a code selection unit suitable for selectively outputting the initial value of the control code in the initialization section, the calibration value of the control code in the calibration section, and the blocking value of the control code before the initialization section.

5. The data output, circuit of claim 4, wherein the second code generation unit comprises:
   a comparator suitable for comparing a voltage of the calibration node with a reference voltage;
   a code generation unit suitable for adjusting the calibration value according to a comparison result of the comparator; and
   a calibration resistance unit coupled to the calibration node and suitable for variable resistance changing the voltage of the calibration node according to the adjusted calibration value.

6. The data output circuit of claim 4,
   wherein the first code generation unit is operable when an initialization signal is enabled; and
   wherein the code selection unit selectively outputs the initial value of the control code when the initialization signal is enabled.

7. The data output circuit of claim 4,
   wherein the second code generation unit is operable when a calibration signal is enabled; and
   wherein the code selection unit selectively outputs the calibration value of the control code when the calibration signal is enabled.

8. The data output circuit of claim 4,
   wherein the third code generation unit is operable when a power-up signal is enabled; and
   wherein the code selection unit selectively outputs the blocking value of the control code when the power-up signal is enabled.

9. The data output circuit of claim 1, wherein the driving unit comprises:
   a pull-up driving unit suitable for pull-up driving the output pad with driving power determined by a first control code of the control code in response to the data signal; and
   a pull-down driving unit suitable for pull-down driving the output pad with driving power determined by a second control code of the control code in response to the data signal.

10. The data output circuit of claim 9,
    wherein the blocking value of the first control code corresponds to a maximum value of the first control code, and wherein the blocking value of the second control code corresponds to a minimum value of the second control code.

11. A data output circuit comprising:
    a control code generation unit suitable for generating a control code; and
    a plurality of transistor pairs each comprising:
    a first transistor operable according to an assigned control signal included in the control code; and
    a second transistor operable according to a data signal,
    wherein the first and second transistors of the respective transistor pairs are coupled in series between an output pad and respective driving voltage nodes,
    wherein the control code generation unit generates an initial value of the control code in an initialization section, a calibration value of the control code in a calibration section, and a blocking value of the control code before the initialization section,
    wherein the calibration value is adjusted by a calibration operation in the calibration section, and
    wherein the transistor pairs are inoperable by the blocking value.

12. The data output circuit of claim 11, wherein the initialization value turns on one or more among the first transistors, and turns off one or more among the remaining first transistors in the transistor pairs.

13. The data output circuit of claim 11, wherein the blocking value turns off all of the first transistors.

14. The data output circuit of claim 11, wherein the control code generation unit comprises:
    a first code generation unit suitable for generating the control code having the initialization value;
    a second code generation unit suitable for generating the control code having the calibration value;
    a third code generation unit suitable for generating the control code having the blocking value; and
    a code selection unit suitable for selectively outputting the initial value of the control code in the initialization section, the calibration value of the control code in the calibration section, and the blocking value of the control code before the initialization section.

15. The data output circuit of claim 14, wherein the second code generation unit comprises:
    a comparator suitable for comparing a voltage of the calibration node with a reference voltage;
    a code generation unit suitable for adjusting the calibration value according to a comparison result of the comparator; and
    a calibration resistance unit coupled to the calibration node and suitable for variable resistance changing the voltage of the calibration node according to the adjusted calibration value.

16. The data output circuit of claim 14,
    wherein the first code generation unit is operable when an initialization signal is enabled; and
    wherein the code selection unit selectively outputs the initial value of the control code when the initialization signal is enabled.

17. The data output circuit of claim 14,
    wherein the second code generation unit is operable when a calibration signal is enabled; and
    wherein the code selection unit selectively outputs the calibration value of the control code when the calibration signal is enabled.

18. The data output circuit of claim 14,
    wherein the third code generation unit is operable when a power-up signal is enabled; and wherein the code selection unit selectively outputs the blocking value of the control code when the power-up signal is enabled.

19. The data output circuit of claim 11, wherein the plurality of transistor pairs comprise:
one or more pull-up transistor pairs coupled between a pull-up driving voltage node and the output pad; and
one or more pull-down transistor pairs coupled between a pull-down driving voltage node and the output pad.

20. The data output circuit of claim 19,
wherein the first and second transistors of the pull-up transistor pair are configured with PMOS transistors,
wherein the first and second transistors of the pull-down transistor pair are configured with NMOS transistors,
wherein the blocking value of the control code for the first transistors of the pull-up transistor pairs corresponds to a maximum value of the control code, and
wherein the blocking value of the control code for the first transistors of the pull-down transistor pairs corresponds to a minimum value of the control code.

* * * * *